United States Patent [19]

Kazama

[11] Patent Number: 5,200,695
[45] Date of Patent: Apr. 6, 1993

[54] CONTACT PROBE

[75] Inventor: Toshio Kazama, Kanagawa, Japan

[73] Assignee: NHK Spring Co., Ltd., Yokohama, Japan

[21] Appl. No.: 739,051

[22] Filed: Jul. 30, 1991

[30] Foreign Application Priority Data

Jul. 30, 1990 [JP] Japan .................................. 2-201999

[51] Int. Cl.⁵ .............................................. G01R 1/073
[52] U.S. Cl. ................................. 324/158 P; 324/72.5
[58] Field of Search ............... 324/158 P, 158 F, 72.5; 439/482

[56] References Cited

FOREIGN PATENT DOCUMENTS 2066590 7/1981 United Kingdom ............ 324/158 P

OTHER PUBLICATIONS

Bohannon, W. D.; "Twin Contact Multiple Connector"; Western Electric Technical Digest No. 22; Apr. 1971; pp. 9-10.

Primary Examiner—Ernest F. Karlsen
Attorney, Agent, or Firm—Baker & Daniels

[57] ABSTRACT

A contact probe consisting of a tubular receptacle, a needle member received in the tubular receptacle in a freely slidable manner, and a compression coil spring coiled around the needle member, and compressed between a shoulder surface defined in the receptacle and another shoulder surface defined in the needle member to urge the needle member out of the front end of the tubular receptacle. The compression coil spring is provided with a large diameter portion at its inner end for elastically engaging with an inner surface of the receptacle so that the needle member may be replaced without requiring the receptacle to be removed.

13 Claims, 3 Drawing Sheets

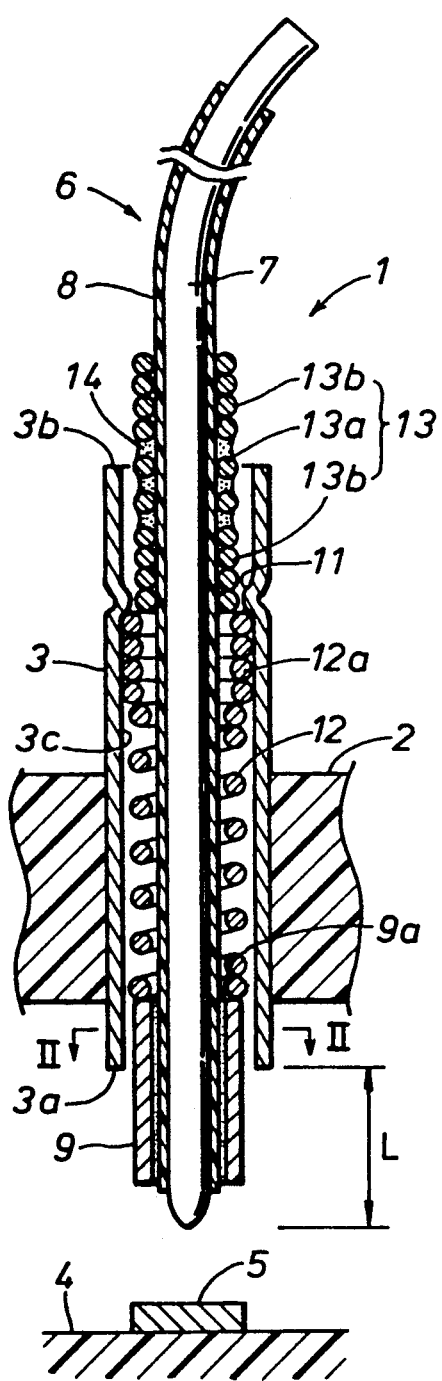
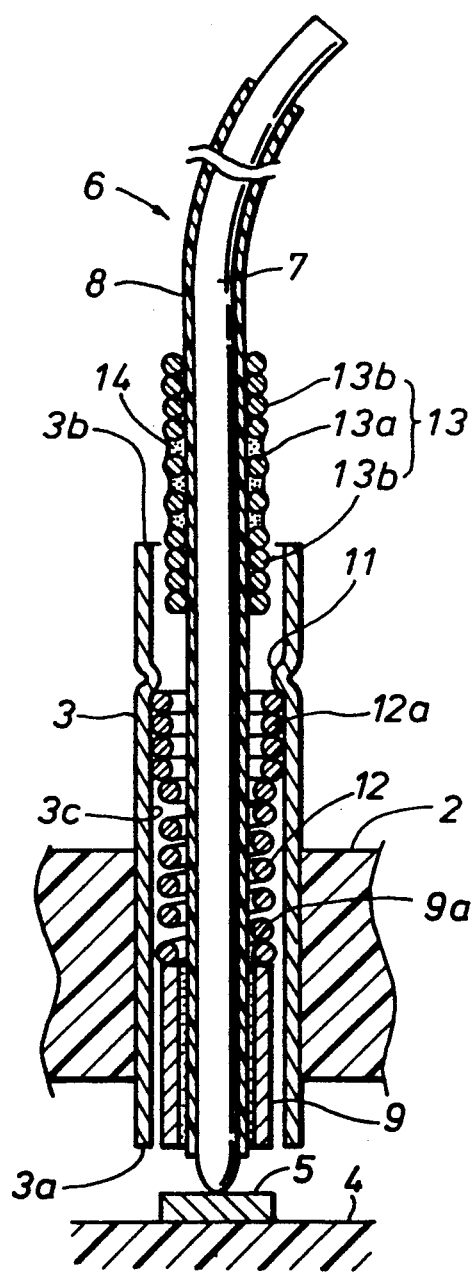

Fig.5
Fig.6
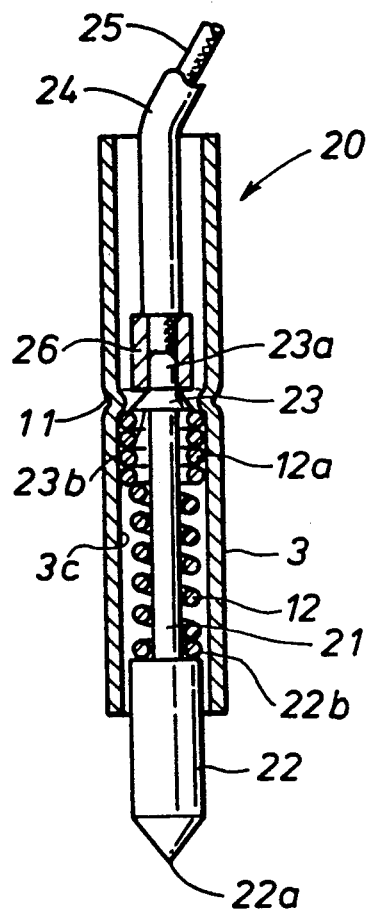
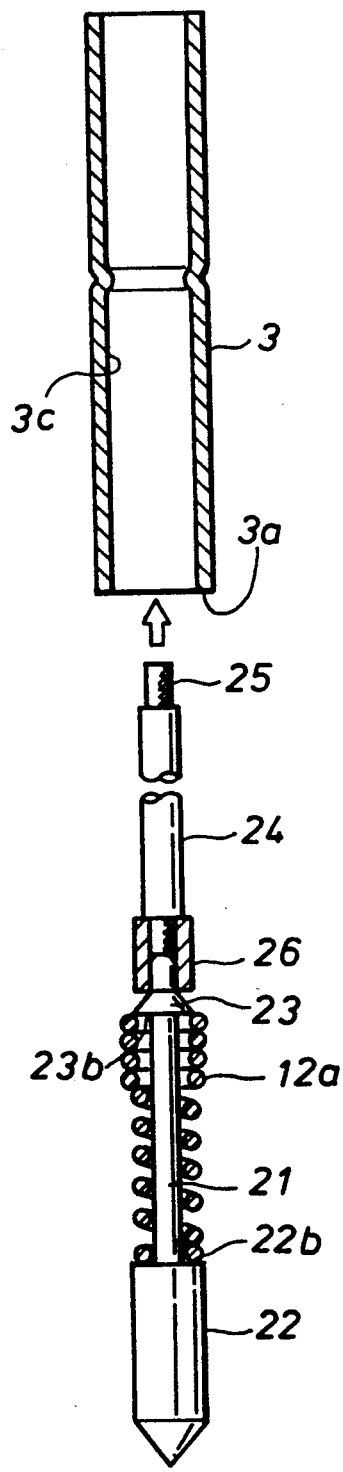

CONTACT PROBE

TECHNICAL FIELD

The present invention relates to a contact probe for establishing an electric contact with an object to be tested such as a printed circuit board, an integrated circuit and other electric devices for testing and monitoring purposes.

BACKGROUND OF THE INVENTION

Conventionally, the contact probe head including a number of contact probes mounted on a common base plate has been used for testing electronic devices as a part of a testing machine. Such a contact probe typically comprises a tubular receptacle, a needle member received therein, and a spring member urging the needle member out of the front end of the receptacle as disclosed in commonly assigned U.S. Pat. No. 5,004,977. The spring member typically consists of a compression coil spring, and is engaged with the receptacle at its one end and with a front end portion of the needle member at its other end.

According to this structure, since the stopper for limiting the projecting movement of the needle member under the spring force of the compression coil spring consists of a coil of wire or a sleeve which is either blazed or crimped onto the needle member, it is not possible to remove the needle member without removing the receptacle also. Since each contact probe head is provided with a large number of densely arranged contact probes, it is not easy to replace the contact probes. Further, since the positional accuracy of each receptacle is highly important for the satisfactory operation of the contact probe head, replacement of a receptacle must be accompanied by a step of ensuring the positional accuracy of the newly installed receptacle, and this means an added work for properly maintaining the condition of a contact probe head.

BRIEF SUMMARY OF THE INVENTION

In view of such problems of the prior art, a primary object of the present invention is to provide a contact probe which allows its needle member to be replaced extremely easily without requiring its receptacle to be removed.

A second object of the present invention is to provide a contact probe which is simple in structure and easy to assemble.

A third object of the present invention is to provide a contact probe which is adapted to be combined into a contact probe head carrying a large number of contact probes in a limited area.

These and other objects of the present invention can be accomplished by providing a contact probe, comprising: a tubular receptacle having a front end and a rear end; a needle ember received in the tubular receptacle in a slidable manner; a compression coil spring coiled around the needle member, and abutting a shoulder surface defined in the receptacle at one end thereof and a shoulder surface defined in the needle member at other end thereof to urge the needle member out of the front end of the tubular receptacle; and means for limiting an extent of the movement of the needle member out of the front end of the tubular receptacle; the compression coil spring being provided with a large diameter portion adjacent the one end which can elastically engage with an inner surface of the receptacle while the rest of the compression coil spring is provided with an outer diameter generally smaller than an inner diameter of the receptacle.

The large diameter portion of the compression coil spring allows the assembly consisting of the needle member and the compression coil spring to be detachably retained in the receptacle by the elastic engagement between the large diameter portion and the inner surface of the receptacle. Therefore, the needle member can be easily replaced without requiring the receptacle to be removed.

According to a preferred embodiment of the present invention, the means for restricting an extent of the movement of the needle member out of the front end of the tubular receptacle consists of a wire coil wrapped around the needle member, and this wire coil has an end which can abut the one end of the compression coil spring so as to limit an extent of the movement of the needle member out of the front end under the spring force of the compression coil spring. This wire coil may extend across the rear end of the receptacle over an entire stroke of the needle member in the receptacle so that the needle member near the rear end of the receptacle may be reinforced against bending or buckling deformations.

If the wire coil comprises a coarsely wound portion, a finely wound portion, and a bonding agent applied to the coarsely wound portion of the wire coil, the bonding agent would not seep out of the wire coil and impair the proper function of the contact probe.

The shoulder surface of the receptacle may consist of an annular bead projecting radially and inwardly from the receptacle while the annular shoulder surface of the needle member may consist of a sleeve fitted onto the needle member.

According to another preferred embodiment of the present invention, the contact probe comprises a lead wire led out of the rear end of the receptacle and connected to the rear end of the needle member via connector means. The rear end portion of the needle member is preferably provided with an enlarged diameter portion which can abut the one end of the compression coil spring so as to limit an extent of the movement of the needle member out of the front end of the tubular receptacle. According to this embodiment, the needle member, the compression coil spring, and said lead wire form a needle member assembly which can be inserted into the receptacle in one body for assembly and maintenance purposes, the compression coil springs being engaged between the read end and the front end of the needle member before the needle member assembly is inserted into the receptacle

BRIEF DESCRIPTION OF THE DRAWINGS

Now the present invention is described in the following with reference to the appended drawings, in which:

FIG. 1 is a longitudinal sectional view showing a first embodiment of the contact probe of the present invention;

FIG. 4 is a view similar to FIG. 1 showing the contact probe when it is applied to a printed circuit board;

FIG. 5 is a longitudinal sectional view showing a second embodiment of the contact probe of the present invention;

FIG. 6 is an exploded perspective view of the second embodiment of the present invention.

DETAILED DESCRIPTION OF THE PREFERRED EMBODIMENTS

Figure 2:
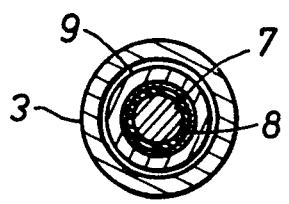
FIG. 2 is a sectional view taken along line II—II of FIG. 1.

FIG. 1 shows a preferred embodiment of the contact probe according to the present invention. This contact probe 1 comprises a tubular receptacle 3 (0.31 mm in outer diameter and 18 mm in length) which is passed through and fixedly secured to a base plate 2 of a contact probe head forming a part of an automated testing machine not shown in the drawings, and a conductive needle 6 consisting of a wire member which is slidably received in the receptacle 3 so as to be brought into contact with an object to be tested such as a printed circuit pattern 5 of a printed circuit board 4 at its front end. The conductive needle member 6 comprises a core conductor 7 consisting of an extremely fine tungsten wire which, for instance, is 0.1 mm in diameter, and an insulating resin layer 8 coated on the outer circumferential surface of the core conductor 7 by a thickness of 5 $\mu$m as illustrated in FIG. 2. The front end of the core conductor 7 projecting from the front end 3a of the receptacle 3, or the lower most end of the core conductor 7 as seen in FIG. 1, as well as the rear portion of the core conductor 7 leading to a control unit not shown in the drawings, is not coated with any such insulating layer, but coated with nickel and gold in that order, as required, for the purpose of maintaining a favorable electroconductivity in relation with other associated parts at all times.

A tubular guide member 9, consisting, for instance, of nickel silver (German silver), is fitted onto a free end portion of the needle member 6 over the resin layer 8, and is fixedly secured thereto with a bonding agent. This guide member 9 ensures the smooth movement of the needle member 6 in the front end 3a of the receptacle 3, and reinforces the needle member 6 against bending and buckling deformations of the front end portion of the needle member 6. The rear end of the needle member 6 extends out of the rear end 3b of the receptacle 3 shown in an upper part of FIG. 1, and is electrically connected to a control unit of a testing machine not shown in the drawings. The resin layer 8 extends a certain distance from the rear end of the receptacle 3.

A middle part of the receptacle 3, preferably adjacent the rear end of the receptacle 3, is provided with an engagement portion 11 consisting of an annular bead projecting radially and inwardly so as to define a constricted part in the inner bore of the receptacle 3. A compression coil spring 12 is coiled around the needle member 6, and is engaged between the annular engagement portion 11 and an annular shoulder surface 9a defined by an upper end 9a of the guide member 9. The end portion of the coil spring 12 engaging with the engagement portion 11 is provided with a large diameter portion 12a over a few turns of the coil wire. The outer diameter of the large diameter portion 12a in its free condition is slightly greater than the inner diameter of the internal bore of the receptacle 3.

A coil of wire 13 is wrapped around the needle member 6 over the resin layer 8 so as to extend between the interior of the receptacle 3 to the exterior of the receptacle 3 over the entire stroke L of the needle member 6. This stroke L, for instance, may be 3 mm. The wire coil 13 consists of a coarsely wound middle portion 13a, and two closely wound end portions 13b situated on either end of the wire coil 13. A small amount of an adhesive agent 14 is applied to the coarsely wound middle portion 13a to fixedly secure the wire coil 13 to the needle member 6. The closely wound portions 13b prevent the bonding agent 14 from seeping out of the wire coil 13b and thereby obstructing the proper functioning of the contact probe 1.

Alternatively, a sheet of thermoplastic resin may the wire coil 13 around the needle member 6 so as to be placed under the coarsely wound portion 13a, and melted by heating for securing the wire coil 13 around the needle member 6.

Since the wire coil 13 is wrapped around the needle member 6 over a length exceeding the stroke L of the needle member 6, the wire coil 13 can be always interposed between the rear end 3b of the receptacle 3 and the needle member 6, and prevents abrupt bending of the part of the needle member 6 near the rear end 3b of the receptacle 3. Further, the wire coil 13 protects the needle member 6 from being rubbed directly against the rear end 3b of the receptacle 3. The wire coil 13 is so flexible that it would not substantially impair the flexibility of the needle member 6.

Figure 3:
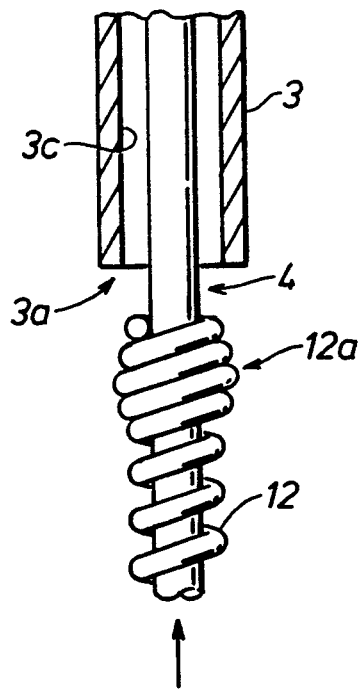
FIG. 3 is an enlarged view showing the manner in which the needle member is fitted into the receptacle.

When assembling this contact probe 1, the compression coil spring 12 is wrapped around the needle member 6, and this needle member assembly is fitted into the receptacle 3 from the front end 3a or the lower end of the receptacle 3 as shown in FIG. 3. In this needle member assembly, the compression coil spring 12 may be retained between the mutually opposing shoulder surfaces of the wire coil 13 and the guide member 9 in a compressed state before inserting this needle member assembly into the receptacle 3 although the wire coil 13 is not shown in FIG. 3 to avoid crowding of the drawing. This assembly is forced into the receptacle 3 until the free end of the large diameter portion 12a of the coil spring 12 abuts the engagement portion 11. Since the outer diameter of the large diameter portion 12a in its free condition is slightly greater than the inner diameter of the internal bore of the receptacle 3, the needle member assembly consisting of the needle member 6 and the coil spring 12 is securely retained in the receptacle 3.

FIG. 1 shows the contact probe 1 of the present invention before it is applied to an object to be tested. The needle member 6 is retained in the receptacle 3 by the large diameter portion 12a of the coil spring 12 elastically engaging with the inner surface 3c of the receptacle 3. Also, the inner or the lower end of the wire coil 13 abuts the outer or the upper end of the compression coil spring 12. Therefore, the compression coil spring 12 urges the needle member 6 out of the lower end of the receptacle 3, but the above mentioned engagement between the wire coil 13 and the compression coil spring 12 limits the movement of the needle member 6 out of the front end 3a of the receptacle 3.

FIG. 4 shows the same contact probe 1 when its needle member 6 is applied to an object to be tested or the circuit pattern 5 formed on the printed circuit board 4. The compression coil spring 12 is compressed and produces a force necessary to urge the front end of the needle member 6 against the circuit pattern 5 and ensure a favorable electric contact therebetween. Since the circuit pattern 5 is electrically connected to the control unit of the testing machine by the integral needle member 6 without any break therein, the contact probe 1 achieves an extremely small electric resistance between the circuit pattern and the testing machine.

When the needle member 6 is required to be replaced for maintenance purpose, it can be easily done by pulling the needle member 6 out of the lower end of the receptacle 3 by a force sufficient to detach the larger diameter portion 12a from the inner surface 3c of the receptacle 3, and leaving the receptacle 3 still attached to the base plate 2. Since the receptacle 3 requires a relatively high positional accuracy, it is quite advantageous to be able to replace the needle member 6 without removing the receptacle 3 from the base plate 2. This is extremely important because each testing machine employs a large number of contact probes mounted on a common base plate; each needle member is so fine that it is necessary to replace some of them from time to time, and replacement of receptacles so densely arranged involves a significant difficulty.

The needle member 6 in the above described embodiment comprised a core conductor 7 which extends continually from the free end of the needle member 6 to the rear end thereof connected to a testing machine without any discontinuity therebetween, and covered by the insulating resin layer 8. In the second embodiment illustrated in FIGS. 5 and 6, the contact probe 20 is provided with a needle member 21 consisting of an elongated rod-like member received in the receptacle 3. This needle member 21 is provided with a front end 22 formed as a large diameter portion having a pointed end 22a, and a rear end 23 formed as an enlarged frustoconical portion. For the electrical communication between the needle member 21 and an external circuit, a lead wire 25 covered by an insulating sheath 24 is connected to the rear end 23 of the needle member 21 by press fitting a tubular portion 26 soldered, brazed, crimped or otherwise secured to the front end of the lead wire 25 onto a cylindrical extension 23a extending from the rear end 23 of the needle member 21.

According to this embodiment, the compression coil spring 22 is engaged between the mutually opposing shoulder surfaces defined by an annular bead 11 projecting radially and inwardly from the receptacle 3 and the front end 22 of the needle member 21, respectively, in a slightly compressed, i.e., preload state.

In assembling this contact probe 20, a needle member assembly consisting of the needle member 21, the compression coil spring 12, and the lead wire 25 connected to the rear end 23 of the needle member 21 is fitted into the receptacle 3 from its front end 3a. The compression coil spring 21 is engaged between the mutually opposing shoulder surfaces 23b and 22b of the rear end 23 and the front end 22 of the needle member 21, respectively, before the needle member assembly is installed into the receptacle 3, as illustrated in FIG. 6.

When the needle member assembly is fully inserted in the receptacle 3, the inner end of the compression coil spring 22 abuts the annular bead 11. Also, the large diameter portion 22a formed in the upper end of the compression coil spring 22 elastically retains the needle member assembly in the receptacle 3 by cooperating with the inner surface 3c of the receptacle 3 in substantially the same manner as in the previous embodiment. Any further inward movement of the needle member 21 will compress the compression coil spring 22 between the annular bead 11 of the receptacle 3 and the front end 22 of the needle member 21.

The replacement of the needle member 21 can be easily carried out by removing and installing it as a part of such a needle member assembly.

Although the present invention has been described in terms of preferred embodiments thereof, it is obvious to a person skilled in the art that various alterations and modifications are possible without departing from the scope of the present invention which is set forth in the appended claims.

What we claim is:

1. A contact probe, comprising:
   a tubular receptacle having an inner surface defining an inner diameter, a front end, and a rear end, said tubular receptacle including a first shoulder surface at one end thereof;
   a needle member slideably received in said tubular receptacle, said needle member including a second shoulder surface at one end thereof;
   a compression coil spring coiled around said needle member, the ends of said coil spring respectively abutting said first and second shoulder surfaces, whereby said needle member is urged out of said front end of said tubular receptacle; and
   means for limiting an extent of movement of said needle member out of said front end of said tubular receptacle;
   said compression coil spring including a large diameter portion adjacent said first shoulder surface, said large diameter portion adapted to frictionally engage said inner surface of said receptacle, the remainder of said compression coil spring having an outer diameter generally smaller than said inner diameter of said receptacle.

2. A contact probe according to claim 1, wherein said means for limiting an extent of the movement of said needle member out of said front end of said tubular receptacle comprises a wire coil securely wrapped around said needle member and having an end which can abut said one end of said compression coil spring.

3. A contact probe according to claim 2, wherein said wire coil extends across said rear end of said receptacle over an entire stroke of said needle member in said receptacle.

4. A contact probe according to claim 3, wherein said wire coil comprises a coarsely wound portion, a finely wound portion, and a bonding agent applied to said coarsely wound portion of said wire coil.

5. A contact probe according to claim 2, wherein said needle member, and said compression coil spring form a needle member assembly which can be inserted into said receptacle in one body for assembly and maintenance purposes, said compression coil springs being engaged between said wire coil and said front end of said needle member before said needle member assembly is inserted into said receptacle.

6. A contact probe according to claim 1, wherein said shoulder surface of said receptacle consists of an annular bead projecting radially and inwardly from said receptacle.

7. A contact probe according to claim 1, wherein said shoulder surface of said needle member is defined by a sleeve fitted onto said needle member.

8. A contact probe according to claim 3, wherein said needle member comprises a continuous core conductor extending from a front end of said needle member at least a certain distance from a rear end of said receptacle.

9. A contact probe according to claim 8, wherein said core conductor is covered by an insulating layer substantially over an entire surface of a part of said core conductor which can be located in said receptacle.

10. A contact probe according to claim 3, further comprising a lead wire led out of the rear end of said receptacle and connected to the rear end of said needle member via connector means.

11. A contact probe according to claim 10, wherein said means for limiting an extent of the movement of said needle member out of said front end of said tubular receptacle comprises a rear end portion of said needle member having an enlarged diameter which can abut said one end of said compression coil spring.

12. A contact probe according to claim 11, wherein said needle member, said compression coil spring, and said lead wire form a needle member assembly which can be inserted into said receptacle in one body for assembly and maintenance purposes, said compression coil spring being engaged between said rear end and said front end of said needle member before said needle member assembly is inserted into said receptacle.

13. A contact probe, comprising:
tubular receptacle having an inner surface defining an inner diameter, a front end and a rear end, said tubular receptacle including a first shoulder surface at one end thereof;
a needle member slideably received in said tubular receptacle, said needle member including a second shoulder surface at one end thereof;
a compression coil spring coiled around said needle member, the ends of said coil spring respectively abutting said first and second shoulder surface, whereby said needle member is urged out of said front end of said tubular receptacle;
said compression coil spring provided with a large diameter portion adjacent said first shoulder surface, said large diameter portion adapted to frictionally engage with said inner surface of said receptacle, the remainder of said compression coil spring having an outer diameter generally smaller than said inner diameter of said receptacle; and
a wire coil securely wrapped around said needle member, said wire coil having an end adapted to abut said large diameter portion of said compression coil spring, said wire coil limiting an extent of movement of said needle member out of said front end under the spring force of said compression coil spring.

* * * * *